US012581899B2

(12) United States Patent
Fuller et al.

(10) Patent No.: US 12,581,899 B2
(45) Date of Patent: Mar. 17, 2026

(54) FILTER MODULE

(71) Applicant: ENTEGRIS, INC., Billerica, MA (US)

(72) Inventors: Matthew A. Fuller, Colorado Springs, CO (US); Colton J. Harr, Monument, CO (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 18/200,965

(22) Filed: May 23, 2023

(65) Prior Publication Data

US 2023/0411192 A1     Dec. 21, 2023

Related U.S. Application Data

(60) Provisional application No. 63/346,740, filed on May 27, 2022.

(51) Int. Cl.
| | |
|---|---|
| *B65D 85/30* | (2006.01) |
| *H01L 21/673* | (2006.01) |
| *F16K 15/06* | (2006.01) |
| *F16K 27/02* | (2006.01) |

(52) U.S. Cl.
CPC .. *H01L 21/67393* (2013.01); *H01L 21/67369* (2013.01); *H01L 21/67376* (2013.01); *H01L 21/67386* (2013.01); *F16K 15/06* (2013.01); *F16K 27/0209* (2013.01)

(58) Field of Classification Search
CPC .............. B65D 85/30; H01L 21/67393; H01L 21/67373; H01L 21/67389; H01L 21/67379; H01L 21/67769; B01D 46/0005; B01D 46/10; B01D 46/645

USPC ................................ 206/454, 710, 711, 832
See application file for complete search history.

(56) References Cited

U.S. PATENT DOCUMENTS

| | | | |
|---|---|---|---|
| 5,755,332 | A | 5/1998 | Holliday et al. |
| 6,187,182 | B1 | 2/2001 | Reynolds et al. |
| 6,875,282 | B2 | 4/2005 | Tanaka et al. |
| 7,063,730 | B2 | 6/2006 | Connor et al. |
| 7,328,727 | B2 | 2/2008 | Tieben et al. |
| 7,400,383 | B2 | 7/2008 | Halbmaier et al. |
| 8,146,623 | B2 | 4/2012 | Tieben et al. |
| 9,997,388 | B2 | 6/2018 | Smith et al. |
| 10,304,702 | B2 | 5/2019 | Okabe et al. |
| 11,209,093 | B2 | 12/2021 | Ogawa |
| 11,448,330 | B2 * | 9/2022 | Matsutori ............. F16K 15/028 |
| 11,887,875 | B2 * | 1/2024 | Narita ............... H01L 21/67393 |
| 11,981,483 | B2 * | 5/2024 | Chuang ................ B01D 46/543 |

(Continued)

FOREIGN PATENT DOCUMENTS

| | | |
|---|---|---|
| CN | 103732312 B | 3/2016 |
| CN | 205845920 U | 12/2016 |

(Continued)

*Primary Examiner* — Luan K Bui

(57) ABSTRACT

A filter module includes an interface body and a filter retention body. A filter can be disposed between the filter retention body and a filter retainer joined to the filter retention body. The filter retention body can further include a valve. The filter retainer can be joined to the filter retention body by a snap fit, a press-fit, or a weld. The filter retainer can include stand-offs configured to contact the filter such that the filter is held away from the filter grill. The filter module can be used for providing purge in a wafer container such as a front opening unified pod (FOUP).

6 Claims, 11 Drawing Sheets

(56) References Cited

U.S. PATENT DOCUMENTS

| | | | |
|---|---|---|---|
| 2005/0077204 A1* | 4/2005 | Sumi ................. | H01L 21/67393 |
| | | | 206/710 |
| 2010/0163452 A1* | 7/2010 | Lin ....................... | F16K 15/147 |
| | | | 206/524.4 |
| 2016/0276190 A1 | 9/2016 | Smith et al. | |
| 2016/0367842 A1 | 12/2016 | Koehler | |
| 2017/0271188 A1* | 9/2017 | Fuller ............... | H01L 21/67379 |
| 2018/0308733 A1* | 10/2018 | Kasama .............. | B01D 46/526 |
| 2019/0211942 A1 | 7/2019 | Chiu et al. | |
| 2020/0343117 A1 | 10/2020 | Eggum et al. | |
| 2020/0365435 A1 | 11/2020 | Fuller et al. | |
| 2021/0111048 A1 | 4/2021 | Narita et al. | |

FOREIGN PATENT DOCUMENTS

| | | | |
|---|---|---|---|
| CN | 104221136 B | 5/2017 | |
| JP | 2016015421 A | 1/2016 | |
| TW | I264042 B | 10/2006 | |
| TW | I289534 B | 11/2007 | |
| TW | 200816349 A | 4/2008 | |
| TW | I528868 B | 4/2016 | |
| WO | 2015132910 A1 | 9/2015 | |
| WO | 2016098516 A1 | 6/2016 | |
| WO | 2016145338 A1 | 9/2016 | |

* cited by examiner

FILTER MODULE

FIELD

This disclosure is directed to a module for containing a filter, particularly a filter module for use with wafer containers.

BACKGROUND

Purge assemblies for wafer containers such as front-opening unified pods (FOUPs) typically include multiple discrete components including a grommet, a filter, a valve, and various sealing members. The filters are typically retained by welding them into place in a filter element that is then included in the purge assembly. Additionally, filter grills used to retain filters can obstruct flow through portions of the filter covered by such grills.

SUMMARY

This disclosure is directed to a module for containing a filter, particularly a filter module for use with wafer containers.

By using a resilient interface body in place of the grommet, and having the filter retainer insert into the interface body, a simple, unified construction can be provided for the purge module. This simplifies construction and prevents failures such as failure to include sealing elements when installing the purge module.

By using stand-offs provided on the filter grill to space the filter apart from the grill, an effective surface area of the filter can be increased by reducing occlusion of the filter surface at points contacting the grill. This can improve flow and reduce pressure drop across the filter. The reduction in pressure drop can reduce vibration or wafer container lift-off when purge is being supplied through the filter.

By retaining a filter only by trapping the perimeter of the filter and using a snap fit such as an annular snap fit, the filter can be retained in place without requiring a weld. This simplifies manufacture and avoid the potential particle generation that can result from having to use an ultrasonic weld to secure the filter. It also can avoid introduction of contaminants such as off-gassing released by adhesive compounds that could otherwise be used to retain the filter.

In an embodiment, a gas exchange module for a substrate container includes a filter housing and an interface body. The interface body includes a bore configured to receive the filter housing. The gas exchange module further includes a filter disposed at an end of the filter housing and a filter retainer joined to the filter housing.

In an embodiment, the filter housing further comprises a valve. In an embodiment, the valve is a check valve.

In an embodiment, the interface body includes one or more retention features disposed on an exterior surface of the interface body.

In an embodiment, the filter retainer is joined to the filter housing by a snap fit formed between one or more first snap fit features provided on the filter retainer and one or more second snap fit features provided on the filter housing. In an embodiment, the filter is retained only by compression between a first retaining surface provided on the filter retainer and a second retaining surface provided on the filter housing. In an embodiment, the filter retainer is joined to the filter housing by a weld. In an embodiment, the weld is a laser weld. In an embodiment, the weld is an ultrasonic weld. In an embodiment, the filter retainer is joined to the filter housing by a press-fit.

In an embodiment, filter retainer includes a retention element provided in an opening defined by the filter retainer. The retention element includes a plurality of pairs of spokes. Each of the plurality of pairs of spokes extends towards a center, and the center defines a passage. Each of the plurality of spokes includes a filter retention beam configured to contact the filter, and a total surface area of the filter retention beams is less than a total surface area of the retention element.

In an embodiment, the interface body comprises a resilient material.

In an embodiment, the substrate container includes a substrate container body defining an internal space, the substrate container including a gas exchange port. The substrate container further includes a gas exchange module disposed in the gas exchange port. The gas exchange module includes a filter housing and an interface body. The interface body includes an interface body, and a bore configured to receive the filter housing. The gas exchange module further includes a filter disposed at an end of the filter housing and a filter retainer joined to the filter housing. The interface body is configured to form a seal at a perimeter of the gas exchange port when the gas exchange module is disposed in the gas exchange port.

In an embodiment, the interface body includes one or more retention features disposed on an exterior surface of the interface body and the gas exchange port includes one or more openings configured to receive the one or more retention features disposed on the exterior surface of the interface body.

In an embodiment, the filter housing includes a valve.

In an embodiment, the filter retainer is joined to the filter housing by a snap fit formed between one or more first snap fit features provided on the filter retainer and one or more second snap fit features provided on the filter housing. In an embodiment, the filter is retained only by compression between a first retaining surface provided on the filter retainer and a second retaining surface provided on the filter housing. In an embodiment, the filter retainer is joined to the filter housing by a weld. In an embodiment, the weld is a laser weld. In an embodiment, the weld is an ultrasonic weld. In an embodiment, the filter retainer is joined to the filter housing by a press-fit.

In an embodiment, filter retainer includes a retention element provided in an opening defined by the filter retainer. The retention element includes a plurality of pairs of spokes. Each of the plurality of pairs of spokes extends towards a center, and the center defines a passage. Each of the plurality of spokes includes a filter retention beam configured to contact the filter, and a total surface area of the filter retention beams is less than a total surface area of the retention element.

In an embodiment, the interface body comprises a resilient material.

In an embodiment, a method of providing gas exchange in a substrate container includes assembling a gas exchange module by inserting filter housing into a bore of an interface body, placing a filter at an end of the filter housing, and attaching a filter retainer to the filter housing. The method further includes inserting the gas exchange module into a gas exchange port of a substrate container.

In an embodiment, attaching the filter retainer to the filter housing includes forming a snap fit between one or more first snap fit features provided on the filter retainer and one or more second snap fit features provided on the filter housing. In an embodiment, the filter is retained only by compression between a first retaining surface provided on the filter retainer and a second retaining surface provided on the filter housing.

In an embodiment, inserting the gas exchange module into the gas exchange port of the substrate container includes forming an interface between openings provided in the gas exchange port and one or more retention features provided on an outer surface of the interface body.

In an embodiment, the method further includes directing a gas flow through the interface body, passing the gas flow through a valve provided in the filter housing, and passing the gas flow through the filter.

In an embodiment, a filter retainer includes a filter retention body defining an opening. The filter retention body has one or more retention elements extending into the opening in a direction transverse to the opening. At least one of the one or more retention elements include one or more stand-offs, each of the one or more stand-offs projecting from a side of the one or more retention elements configured to face a filter to be secured by the filter retainer. A surface area of contact surfaces of the one or more stand-offs is less than a surface area of the one or more retention elements.

In an embodiment, the opening is circular in shape.

In an embodiment, the one or more retention elements include a central body and a plurality of spokes. In an embodiment, the one or more stand-offs are disposed at junctions between the central body and the plurality of spokes.

In an embodiment, the one or more retention elements include a plurality of spokes configured to meet at a center of the opening.

In an embodiment, the one or more retention elements form a grid over the opening.

In an embodiment, the one or more retention elements include a plurality of pairs of spokes. Each of the plurality of pairs of spokes extends towards a center, and the center defines a passage. In an embodiment, the one or more stand-offs are filter retention beams provided on the spokes of the plurality of pairs of spokes.

In an embodiment, the filter retention body includes an attachment portion including a snap fit feature.

In an embodiment, a filter assembly includes a filter and a filter retainer. The filter retainer includes a filter retention body defining an opening and has one or more retention elements extending into the opening in a direction transverse to the opening. At least one of the one or more retention elements include one or more stand-offs, each of the one or more stand-offs projecting from a side of the one or more retention elements configured to face the filter. A surface area of contact surfaces of the one or more stand-offs is less than a surface area of the one or more retention elements. The filter contacts the filter retainer at the stand-offs.

In an embodiment, the opening is circular in shape.

In an embodiment, the one or more retention elements include a central body and a plurality of spokes. In an embodiment, the one or more stand-offs are disposed at junctions between the central body and the plurality of spokes. In an embodiment, the central body is a ring.

In an embodiment, the one or more retention elements include a plurality of spokes configured to meet at a center of the opening.

In an embodiment, the one or more retention elements form a grid over the opening.

In an embodiment, the one or more retention elements include a plurality of pairs of spokes. Each of the plurality of pairs of spokes extends towards a center, and the center defines a passage. In an embodiment, the one or more stand-offs are filter retention beams provided on the spokes of the plurality of pairs of spokes.

In an embodiment, the filter retention body includes an attachment portion including a snap fit feature.

In an embodiment, the filter assembly further includes a canister and the filter retention is joined to the canister. In an embodiment, the filter assembly further includes a purge port and the filter retention is joined to the purge port. In an embodiment, the filter assembly further includes a gas exchange module and the filter retention is joined to the gas exchange module. In an embodiment, the filter assembly further includes an enclosure having a port and the filter retention is joined to the port.

In an embodiment, a method of retaining a filter includes securing the filter using a filter retainer, the filter retainer including a filter retention body defining an opening, the filter retention body having one or more retention elements extending into the opening in a direction transverse to the opening. At least one of the one or more retention elements include one or more stand-offs, each of the one or more stand-offs projecting from a side of the retention elements configured to face a filter to be secured by the filter retainer. A surface area of contact surfaces of the one or more retention elements is less than a surface area of the one or more retention elements, and the filter contacts the filter retainer at the stand-offs.

In an embodiment, a filter retainer includes a filter retainer body defining an opening. The filter retainer body has a contact surface surrounding the opening, a filter contact surface, and a snap fit retention feature provided on one or more inner surfaces of one or more walls. The one or more walls surround the filter contact surface.

In an embodiment, the snap fit retention feature is an annular projection.

In an embodiment, the snap fit retention feature includes a plurality of projections.

In an embodiment, the snap fit retention feature is an annular groove.

In an embodiment, the snap fit retention feature includes a plurality of depressions formed in the one or more inner surfaces.

In an embodiment, a filter assembly includes a port body. The port body includes a port filter contact surface and a port snap fit feature. The filter assembly further includes a filter and a filter retainer. The filter retainer includes a filter retainer body defining an opening. The filter retainer body has a contact surface surrounding the opening, a retainer filter contact surface, and a retainer snap fit feature provided on one or more inner surfaces of one or more walls. The one or more walls surrounds the filter contact surface. A portion of the filter is compressed between the port filter contact surface and the retainer filter contact surface. The port snap fit feature is configured to form a snap fit with the retainer snap fit feature.

In an embodiment, the filter is retained only by compression between the port filter contact surface and the retainer filter contact surface.

In an embodiment, the port body is included in a canister, the canister having a canister body including a resilient material. In an embodiment, the port body is included in a purge port. In an embodiment, the port body is included in an enclosure. In an embodiment, the port body is included in a gas exchange module.

In an embodiment, the filter retainer includes one or more retention elements extending across an opening of the filter retainer. At least one of the one or more retention elements includes one or more stand-offs, each of the one or more stand-offs projecting from a side of the one or more retention elements configured to face the filter. A surface area of contact surfaces of the one or more stand-offs is less than a surface area of the one or more retention elements. The filter contacts the filter retainer at the stand-offs.

In an embodiment, filter retainer includes a retention element provided in an opening defined by the filter retainer. The retention element includes a plurality of pairs of spokes. Each of the plurality of pairs of spokes extends towards a center, and the center defines a passage. Each of the plurality of spokes includes a filter retention beam configured to contact the filter, and a total surface area of the filter retention beams is less than a total surface area of the retention element.

In an embodiment, a method of assembling a filter assembly includes placing a filter between a port body and a filter retainer and snapping the filter retainer onto the port body such that one or more port body snap fit features provided on the port body engage with one or more retainer snap fit features provided on the filter retainer.

In an embodiment, the filter is compressed between a port filter contact surface and a retainer filter contact surface.

In an embodiment, the method further includes retaining a position of the filter only by the compression of the filter between the port filter contact surface and the retainer filter contact surface.

In an embodiment, the method further includes contacting the filter at stand-offs provided on one or more retention elements extending into an opening of the filter retainer, wherein a contact area of the stand-offs is less than a surface area of the one or more retention elements.

In an embodiment, the port body is included in a canister. In an embodiment, the port body is included in a purge port. In an embodiment, the port body is included in an enclosure. In an embodiment, the port body is included in a gas exchange module.

DRAWINGS

DETAILED DESCRIPTION

This disclosure is directed to a module for containing a filter, particularly a filter module for use with wafer containers.

Figure 1:
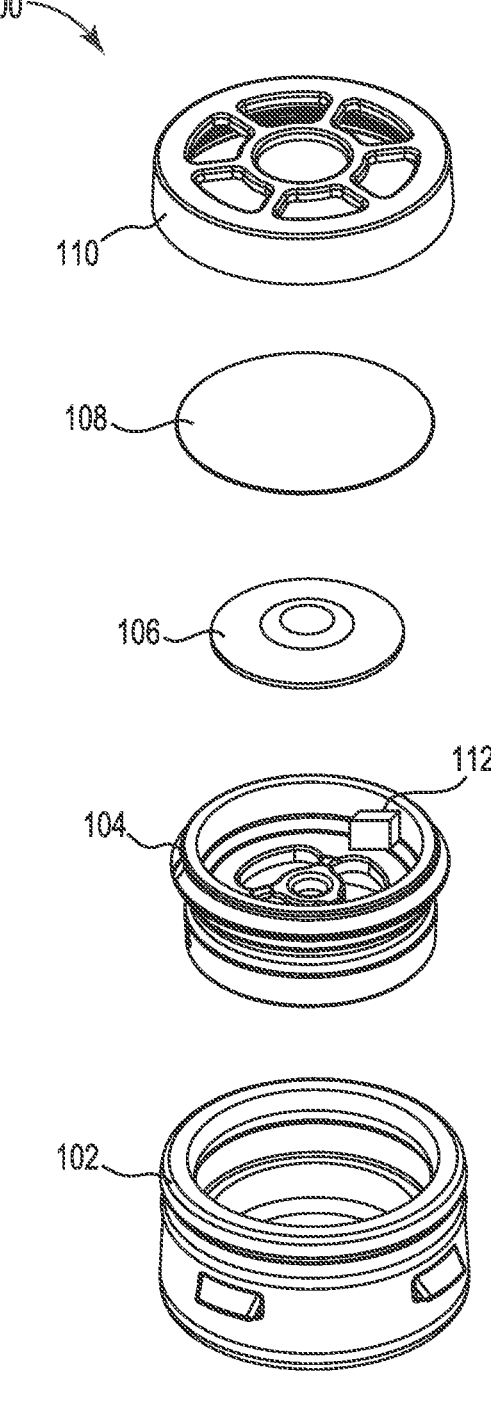
FIG. 1 shows an exploded view of a filter module according to an embodiment.

FIG. 1 shows an exploded view of a filter module according to an embodiment. Filter module 100 includes interface body 102 and filter housing 104. The filter module 100 can optionally include one or more operational elements. Optionally, valve 106 can be included in filter housing 104 as an operational element. Filter 108 can be retained between filter housing 104 and filter retainer 110. Optionally, a sensor 112 can be incorporated into the filter housing 104 as an operational element.

Filter module 100 is configured to be accommodated in a wafer container such as a front-opening unified pod (FOUP). The filter module is configured to provide an interface with a fluid source such as a source of purge gas, and to direct the received fluid through the filter 108. The fluid can be any suitable liquid or gas to be introduced into the wafer container. Optionally, filter module 100 further includes valve 106 to meter flow into the wafer container or prevent flow out of the wafer container by way of filter module 100.

Interface body 102 is a body configured to interface with the fluid source such as the source of purge gas. Interface body 102 further includes a bore configured to accept a portion of the filter housing such that filter housing 104 can be inserted into the bore. The interface body 102 can be made of a resilient material configured to form seals between interface body 102 and the portion of filter housing 104 inserted into the bore of interface body 102. Further, the resilient material of interface body 102 can be configured to form a seal between the interface body 102 and a portion of the wafer container such as a purge port opening that the interface body 102 can be inserted into. Interface body 102 can be configured such that the interface body 102 can be retained in a portion of the wafer container such as a purge port opening that the interface body 102 can be inserted into. The retention can be provided, for example, by sizing interface body 102 to provide a press-fit, providing one or more retention features such as projections on the surface of interface body, or any other suitable structure included on the interface body 102.

Filter housing 104 is configured to be inserted into the bore provided in interface body 102 and is configured to be connected to filter retainer 110 such that the filter 108 can be secured in the path of fluid entering filter module 100 at interface body 102. Filter housing 104 can optionally include one or more features configured to interface with features provided in the bore of interface body 102 such that filter housing 104 is retained in interface body 102. In an embodiment, filter housing 104 forms a press-fit with the bore formed in interface body 102.

One or more operational elements can be included in filter module 100 to interact with the flow therethrough. The operational elements can be, as non-limiting examples, valves, sensors, or any other suitable device for interacting with the flow, for example to measure and/or control characteristics of the flow. One example of an operational element can be a valve 106. Valve 106 can optionally be included in filter housing 104 as an operational element. In an embodiment, valve 106 is a check valve configured to prevent flow towards interface body 102. Valve 106 can be, for example, a check valve assembly, an umbrella valve, or any other suitable valve for metering flow or preventing flow towards interface body 102. The valve 106 can be retained in the body of filter housing 104, for example by having a projection of an umbrella valve extend through an aperture provided in filter housing 104.

Filter 108 can be any suitable media for filtering fluid flowing through the filter module 100. The filter 108 can be, as a non-limiting example, a disc of the filter media. Filter 108 can further include a porous material surrounding the filter media. In an embodiment, filter 108 is retained by clamping between filter housing 104 and filter retainer 110. In an embodiment, filter 108 is welded to the filter housing 104 or filter retainer 110, for example by an ultrasonic weld.

Filter retainer 110 is configured to be joined to filter housing 104 such that filter 108 is retained in place. Filter retainer 110 can include a contact surface configured to clamp the filter 108 against one or more surfaces provided on filter housing 104. In an embodiment, filter retainer 110 includes one or more snap fit retention features for attachment to filter housing 104. In an embodiment, the filter retainer 110 includes one annular snap fit retention feature for attachment to a corresponding annular feature provided on filter housing 104. In an embodiment, filter retainer 110 includes one or more retention elements configured to support and retain the filter. Optionally, the retention elements of filter retainer 110 can include stand-offs configured to contact filter 108 with a reduced surface area compared to a surface area of the entirety of the one or more retention elements.

In an embodiment, one or more sensors can be included among operational elements included in filter module 100. One example of such an operational element is sensor 112. Sensor 112 can optionally be included in the filter module 100. Sensor 112 can be a wired or wireless sensor disposed in either filter housing 104 or interface body 102. The sensor 112 can be any suitable sensor measuring characteristics of interest, such as relative humidity, presence of volatile organic compounds (VOCs), pressure, oxygen levels, or the like.

Figure 2:
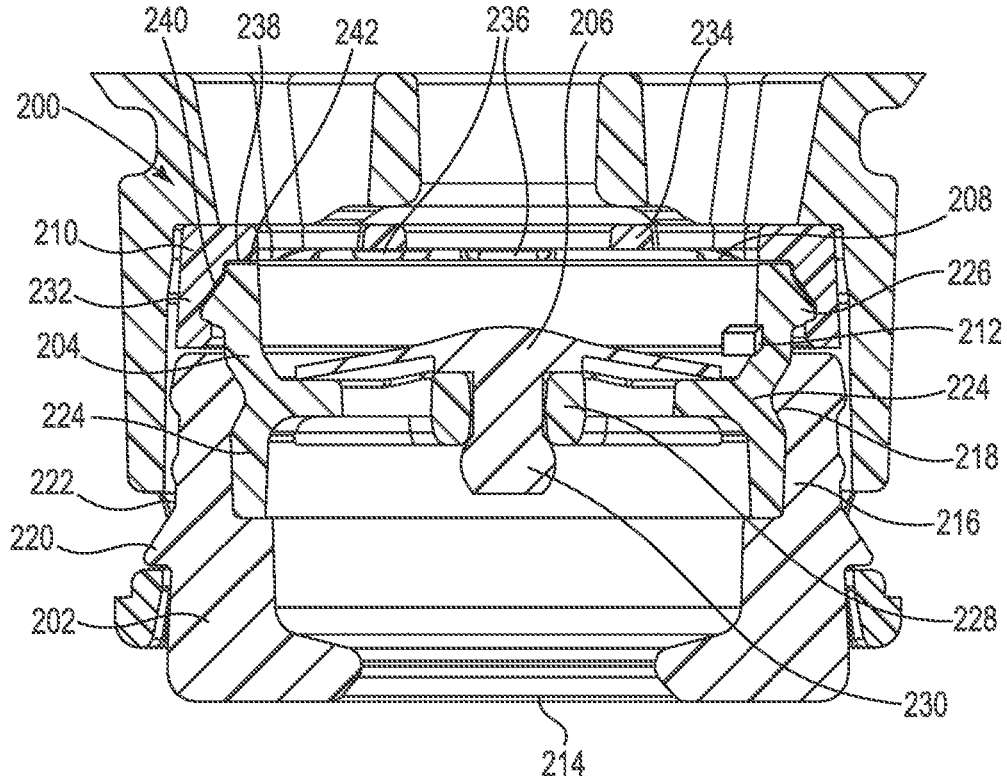
FIG. 2 shows a sectional view of a filter module according to an embodiment.

FIG. 2 shows a sectional view of a filter module according to an embodiment. Filter module 200 includes interface body 202 and filter housing 204. Optionally, valve 206 can be included in filter housing 204. Filter 208 can be retained between filter housing 204 and filter retainer 210. Optionally, a sensor 212 can be incorporated into the filter housing 204.

Filter module 200 is a filter module configured to be used with a wafer container such as a FOUP. For example, filter module 200 can be inserted in a purge port of the wafer container to position a filter in a flow path by which a purge gas is introduced into the wafer container.

Interface body 202 includes an aperture 214 configured to interface with a purge source such as a purge source included in a tool that the wafer container interfaces with. The aperture 214 can be configured to receive a portion of the purge source.

Interface body 202 further includes a bore 216 configured to receive an insertion portion 224 of filter housing 204. One or more interface body retention features 218 can be formed in the bore 216. The interface body retention features can be 218, for example, one or more projections or recesses configured to retain filter housing 204 in bore 216. In an embodiment, the interface body retention feature 218 is an annular projection. In an embodiment, the interface body retention feature 218 is an annular groove. In an embodiment, at least a portion of the bore 216 provides the interface body retention feature 218 by being sized such that a press-fit is formed between the filter housing 204 and the bore 216.

Interface body 202 can further include engagement features 220 formed on an outer surface 222 of the interface body 202. The engagement features 220 can be configured to engage with the wafer container, for example at opening provided on the inner surface of the port that filter module 200 is to be inserted into. In an embodiment, engagement features 220 are a plurality of projections from outer surface 222. In an embodiment, each of the projections is configured to facilitate insertion, for example by having a ramped surface on an upper side of the engagement feature 220. In an embodiment, the engagement features 220 are one or more annular ribs surrounding the interface body 202. In an embodiment, interface body 202 is press-fit into the wafer container with contact being made at smooth outer surfaces of the interface body, without using discrete engagement features 220 projecting from or formed in the outer surface of interface body 202.

Interface body 202 can be made of or include a resilient material capable of being compressed when the interface body 202 is within a corresponding port provided on a wafer container, such that the interface body 202 can form a seal when within the port. The resilient material can be, for example, an elastomer such as a fluoroelastomer. A non-limiting example of such a resilient material is FKM. The resilient material can be, for example, a thermoplastic elastomer. Non-limiting examples of thermoplastic elastomers suitable for use as the resilient material include styrenic block copolymer, thermoplastic polyolefin elastomer, and the like. The resilient material can further be included at aperture 214, such that the interface body 202 can seal to the purge source being used with the wafer container including purge module 200.

Filter housing 204 includes insertion portion 224, configured to be received in bore 216 of interface body 202. The insertion portion 224 can include one or more filter housing retention features 226. The filter housing retention features 226 can be configured to combined with the interface body retention features 218 to secure the filter housing 204 to interface body 202. The filter housing retention features 226 can be, for example, one or more projections or recesses formed in a surface of insertion portion 224. In an embodiment, the filter housing retention feature 226 is an annular projection. In an embodiment, the filter housing retention feature 226 is an annular groove. In an embodiment, at least a portion of the bore insertion portion 224 provides the filter housing retention feature 226 by being sized such that a press-fit is formed between the filter housing 204 and the bore 216. The bore 216 can be configured such that fluid received at aperture 214 can pass into the filter housing 204.

Valve 206 is a valve that can optionally be included in filter housing 204. Valve 206 can be any suitable valve to control flow through the filter housing 204. In an embodiment, valve 206 is a check valve, such as a mechanical check valve, a duckbill valve, or an umbrella valve. In an embodiment, valve 206 is an umbrella valve. When valve 206 is an umbrella valve, filter housing 204 can include a ring 228 through which a stem 230 of the valve 206 can extend, retaining the umbrella valve in place within filter housing 204. In an embodiment, valve 206 is a mechanical check valve assembly.

Filter 208 is a filter retained between filter housing 204 and filter retainer 210. In an embodiment, filter 208 is one or more pieces of filter media. In an embodiment, filter 208 includes a coating or a container on or surrounding filter media. In an embodiment, the container for the filter media of filter 208 is sheets of permeable materials joined to one another, for example by way of an ultrasonic weld. Filter 208 can be any suitable filter for the fluid being passed through purge module 200.

Filter retainer 210 can be joined to filter housing 204 to retain filter 208. Filter retainer 210 includes outer perimeter portion 232, one or more filter retention elements 234, one or more stand-offs 236, a filter contact surface 238, and a retainer attachment feature 240. Outer perimeter portion 232 is configured to surround an end of filter housing 204 to which filter retainer 210 attaches. Outer perimeter portion 232 defines an opening. Optionally, one or more filter retention elements 234 can be positioned within the opening, for example to prevent the filter 208 from being pushed out or otherwise escaping filter housing 204 and filter retainer 210. In an embodiment, the filter retention elements 234 include a central ring and a plurality of spokes joining the central ring to the outer perimeter portion 232. In an embodiment, the filter retention elements 234 include one or more lengths extending across the opening, for example to provide a grill. In an embodiment, one or more stand-offs 236 extend from the one or more filter retention elements 234 on a side facing filter 208 when the purge module 200 is assembled. The one or more stand-offs 236 can contact filter 208 so as to position filter 208 away from at least a portion of the one or more filter retention elements 234. A surface area of the stand-offs 236 contacting filter 208 can be smaller than the surface area of the filter retention elements 234, such that less of the filter 208 is obstructed by contact with stand-offs 236 when compared with contacting the filter retention elements 234.

Filter contact surface 238 can be provided as part of outer perimeter portion 232. The filter contact surfaces 238 face towards the filter housing 204 when the purge module 200 is assembled. The filter contact surfaces 238 can be spaced apart from opposing filter contact surfaces 242 of filter housing 204 by a distance equal to or less than the thickness of filter 208, such that filter 208 is clamped between filter contact surface 238 and corresponding filter contact surface 242 provided on filter housing 204. The filter 208 can, in an embodiment, be retained only by being clamped between filter contact surface 238 and filter housing 204. In an embodiment, the filter 208 can be secured to one or both of filter contact surface 238 and filter housing 204 by an adhesive. In an embodiment, the filter 208 can be secured to one or both of filter contact surface 238 and filter housing 204 by a weld.

Retainer attachment feature 240 allows the filter retainer 210 to be mechanically joined to the filter housing 204. In an embodiment, retainer attachment feature 240 is an annular recess or an annular projection configured to form a snap-fit with a corresponding filter housing attachment feature 242 provided on filter housing 204. In an embodiment, retainer attachment feature 240 includes a plurality of projections or recesses, such as snaps, detents, or the like, configured to interface with corresponding filter housing attachment features 242.

Sensor 212 can optionally be included in purge module 200. Sensor 212 can be any suitable sensor capable of measuring one or more parameters of interest, such as flow velocity, relative humidity, presence and/or amount of chemicals such as volatile organic compounds (VOCs) or oxygen, or the like. In an embodiment, sensor 212 is positioned within the interface body 202. In an embodiment, sensor 212 is positioned within filter housing 204.

Figure 3:
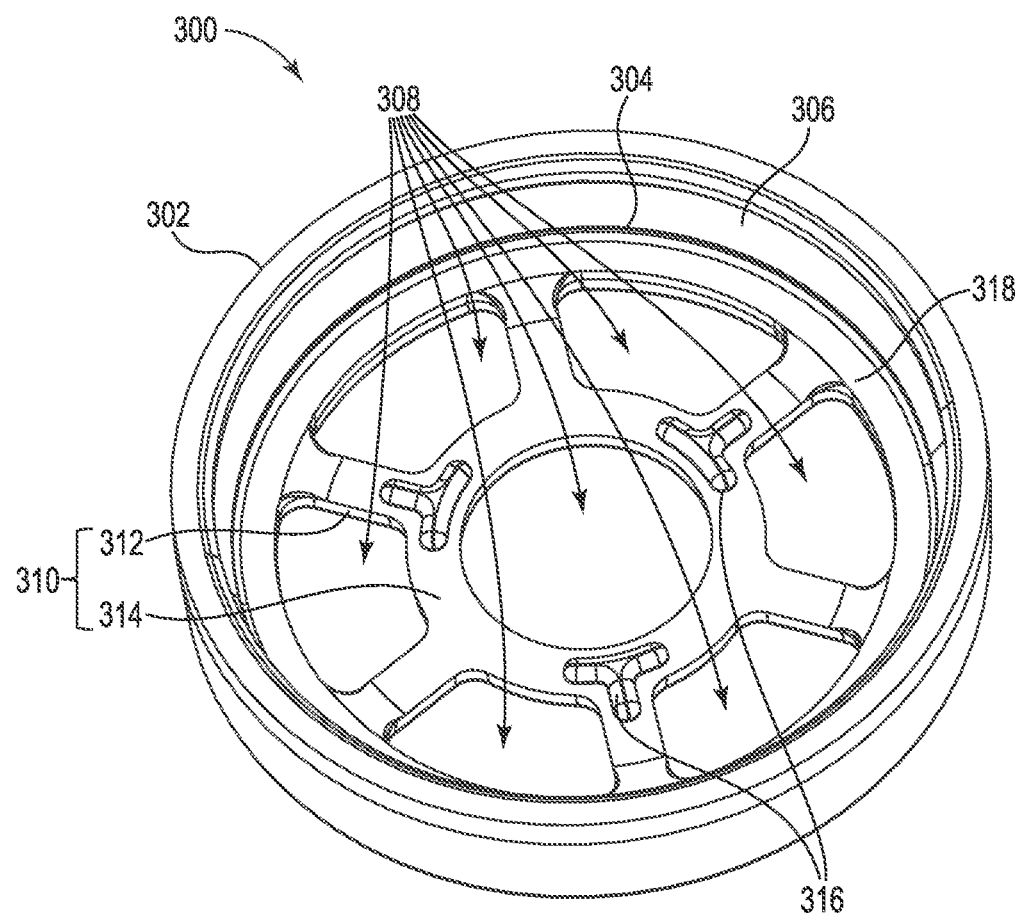
FIG. 3 shows a filter retainer according to an embodiment.

FIG. 3 shows a filter retainer according to an embodiment. Filter retainer 300 includes outer ring 302 having inner surface 304 and attachment feature 306 formed on the inner surface 304. Outer ring 302 defines an opening 308. Retention elements 310 extend into the opening 308. In the embodiment shown in FIG. 3, the retention elements 310 include a plurality of spokes 312 and a central ring 314. Stand-offs 316 are provided on retention elements 308 on a side facing the filter when filter retainer 300 is in use. Filter contact surface 318 is provided on outer ring 302 on a side facing towards the filter when the filter retainer 300 is in use.

Filter retainer 300 is configured to be attached to a structure such as a purge module, a port, or a filter adapter such as filter housing 204 to retain a filter such as filter 208, as those are described above and shown in FIG. 2. The filter retainer 300 can be a single piece in an example embodiment. The filter retainer 300 can be made of a rigid plastic material, such as polycarbonate, high-density or ultra-high molecular weight polyethylene (HDPE or UHMWPE), or any other such suitable rigid polymer material.

Outer ring 302 defines the perimeter of filter retainer 300. While the outer ring 302 is shown as being circular in profile in FIG. 3, it is understood that filter retainer 300 can be shaped to correspond to the purge module, port, or filter adapter it is configured to be used with, with corresponding changes to the shape of outer ring 302, such as oval, square, rectangular, or other such profiles. The outer ring 302 includes inner surface 304 on a bore defined by outer ring 302. The bore defined by inner surface 304 is configured to fit over a purge module, port, or filter adapter. An attachment feature 306 can be formed on or in the bore defined by inner surface 304. The attachment feature 306 can include one or more projections from or depressions in inner surface 304. In an embodiment, the attachment feature 306 is an annular groove formed in inner surface 304. In an embodiment, the attachment feature 306 is an annular projection formed on inner surface 304. Attachment feature 306 can be configured to interface with one or more features formed on the purge module, port, or filter adapter that filter retainer 300 is used with. The attachment feature 306 can allow the filter retainer 300 to be joined to the corresponding purge module, port, or filter adapter by a mechanical connection such as a snap-fit. In an embodiment, the snap-fit is a snap-fit between an annular attachment feature 306 and a corresponding annular feature on the corresponding purge module, port, or filter adapter. Other examples of attachment features can include continuous or interrupted threading, a plurality of snap-fit features, one or more interference fit surfaces, detents, or the like.

Opening 308 is defined by the outer ring 302. In an embodiment, opening 308 is surrounded by the filter contact surface 318 described below. Opening 308 is configured to allow fluid passing through the filter to further pass through the filter retainer 300. Opening 308 can include multiple open regions separated by retention elements 310. Retention elements 310 can extend into or across opening 308. Retention elements 310 can prevent escape and reduce or prevent bowing of the filter when it is retained by filter retainer 300 and pressure is applied to the filter, for example by the fluid passing through said filter. In embodiments, the retention elements 310 can include one or more bars extending across the opening 308. In embodiments, the retention elements 310 can include multiple elements that intersect one another, for example meeting at a center, forming a grid over opening 308, or the like. In an embodiment, the retention elements 310 include a central ring 314 connected to the outer ring 302 by a plurality of spokes 312.

Stand-offs 316 can project from retention elements 310 at one or more predetermined positions on the retention elements 310. The stand-offs 316 provide a contact surface configured to contact the filter that is smaller than the surface of the retention elements 310 that could otherwise contact the filter. The number, position, surface area, and height of the stand-offs 316 can be based on the support requirements and mechanical properties of the filter that filter retainer 300 is used to retain. For example, the stiffness of the filter media and/or the pressure on the filter can affect the number of stand-offs 316, their positioning, and/or the area of those stand-offs 316 that is required to reduce flexing or bowing of the filter beyond allowable levels. In an embodiment, the stand-offs are provided at one or more junctions between spokes 312 and a central ring 314. In an embodiment, one or more of the stand-offs 316 can be continuous over a length defined from a first point on the outer ring 302 to a second point on the outer ring 302, such as the filter retention beams 914 described below and shown in FIG. 9.

Filter contact surface 318 is a surface of filter retainer 300 between the inner surface 304 and the opening 308. The filter contact surface 318 can include some or all of that area between inner surface 304 and opening 308. Filter contact surface 318 faces towards the filter when filter retainer 300 is installed on the corresponding purge module, port, or filter adapter. In an embodiment, filter contact surface 318 contacts the filter such that the filter is compressed when filter retainer 300 is installed. In an embodiment, the filter is attached to filter contact surface 318 by a weld or adhesive. In an embodiment, the compression of the filter by filter contact surface 318 and a surface of the purge module, port, or filter adapter is the only force retaining the filter in place. In an embodiment, the filter contact surface 318 is a flat surface. In an embodiment, the filter contact surface includes texturing such as projections, grooves, surface roughness, combinations thereof, or the like to engage the filter. In an embodiment, at least a portion of stand-offs 316 can be continuous with the filter contact surface 318, such as the filter retention beams 914 described below and shown in FIG. 9.

Figure 4A:
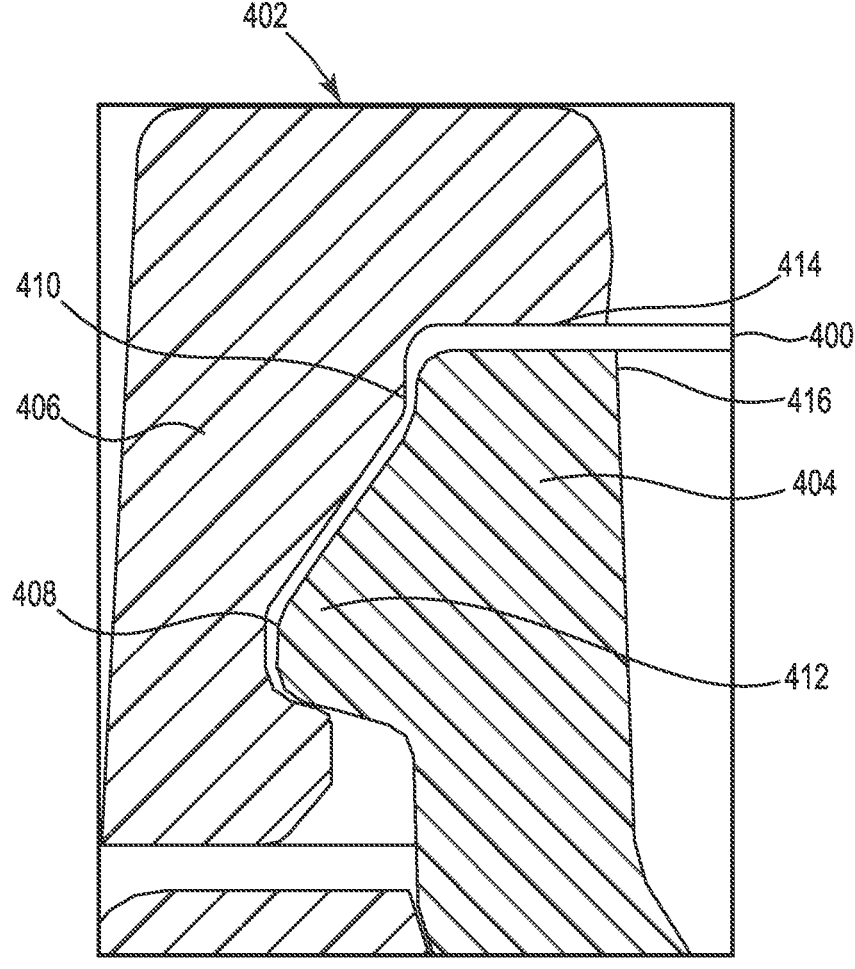
FIG. 4A shows a sectional view of a filter and filter retainer according to an embodiment.

FIG. 4A shows a sectional view of a filter and filter retainer according to an embodiment. Filter 400 is retained by clamping between filter retainer 402 and filter adapter 404. Filter retainer 402 includes outer ring 406, with a snap-fit recess 408 formed on an inner surface 410 provided in the outer ring 406. The filter adapter 404 includes a snap-fit projection 412.

Filter 400 is a filter retained between filter adapter 404 and filter retainer 402. In an embodiment, filter 400 is one or more pieces of filter media. In an embodiment, filter 400 includes a coating or a container on or surrounding filter media. In an embodiment, the container for the filter media of filter 400 is sheets of permeable materials joined to one another, for example by way of an ultrasonic weld.

Filter retainer 402 is configured to retain the filter 400 in place. Filter retainer 402 can be, for example, the filter retainer 300 as discussed above and shown in FIG. 3. The filter retainer 402 can be configured such that filter 400 is clamped between a filter contact surface 414 of the filter retainer 402 and a corresponding filter contact surface 416 of the filter adapter 404. In an embodiment, filter contact surfaces 414, 416 can be flat surfaces. In an embodiment, filter contact surfaces 414, 416 can be in plane with the plane of filter 400. In an embodiment, filter contact surfaces 414, 416 can be angled with respect to the plane of filter 400. In an embodiment, one or both of filter contact surfaces 414, 416 can include surface features such as bumps, ridges, grooves, texturing, projections, recesses, or the like. In an embodiment, the clamping between the filter contact surfaces 414, 416 can be the only retention of the filter 400. Outer ring 406 defines the perimeter of filter retainer 402. Outer ring 406 can have any suitable shape such that it corresponds to the shape of filter adapter 404. The outer ring 406 includes an inner surface 410 facing towards a center of the filter retainer 402. Snap-fit recess 408 is formed in the inner surface 410. Snap-fit recess 408 is configured to accommodate the snap-fit projection 412. In an embodiment, a plurality of snap-fit recesses 408 are provided in inner surface 410, corresponding to a plurality of snap-fit projections 412 on the filter adapter 404. In an embodiment, the snap-fit recess 408 is an annular recess formed in the inner surface 410.

Figure 7:
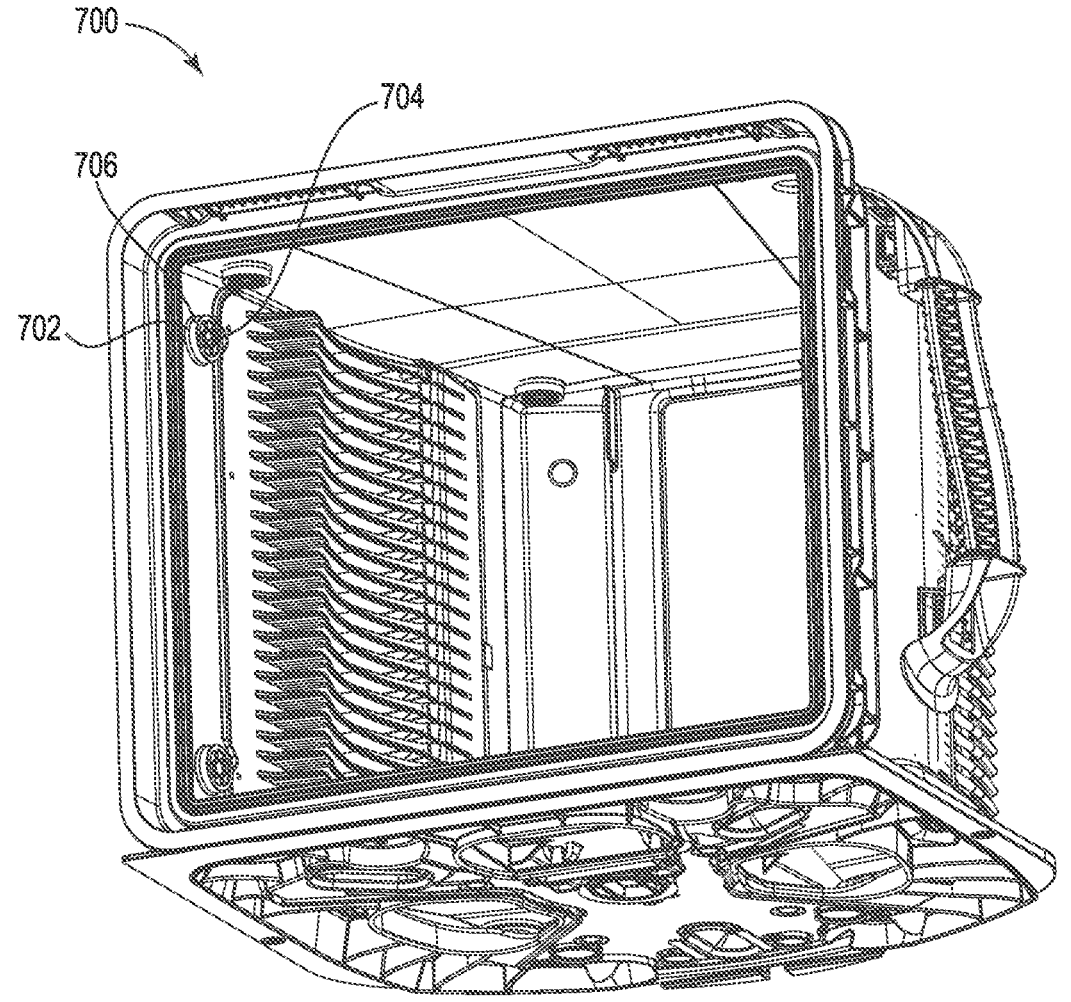
FIG. 7 shows a perspective view of an enclosure according to an embodiment.
Figure 8:
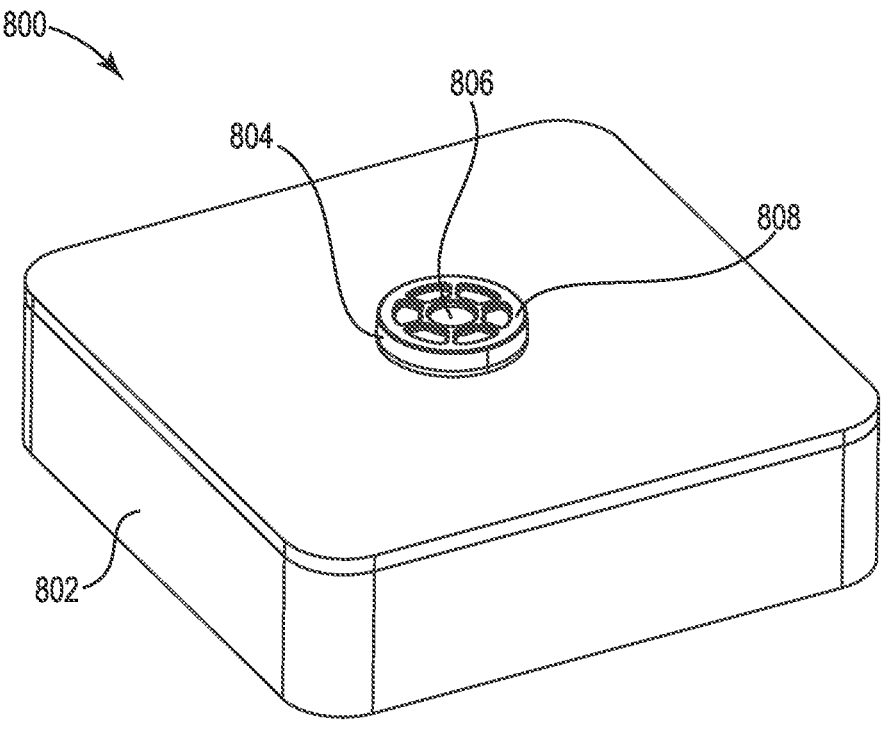
FIG. 8 shows a container according to an embodiment.

Filter adapter 404 is configured to allow attachment of filter retainer 402 such that filter 400 can be retained therebetween. In an embodiment, filter adapter 404 is a filter housing such as filter housing 204 as shown in FIG. 2 and discussed above. In an embodiment, filter adapter 404 is provided as a filter adapter of a canister such as canister 600 described below and shown in FIG. 6. In an embodiment, filter adapter 404 is a port included in an enclosure, such as port 702 provided on enclosure 700 as shown in FIG. 7 and described below. In an embodiment, filter adapter 404 is included in a container such as container 800 as shown in FIG. 8 and described below. Filter adapter 404 includes a snap-fit projection near an end having the filter contact surface 416. Snap-fit projection 412 is a projection formed on an outer surface of the filter adapter 404. The snap-fit projection 412 can include one or more projections. In an embodiment, the snap-fit projection 412 is an annular projection. In an embodiment, the snap-fit projection 412 can include a ramped surface towards an end of the filter adapter 404 and a sharp corner on a side away from the end of filter adapter 404. The ramped surface can facilitate interface with the inner surface 410 of filter retainer 402. The sharp corner can provide an interface by which the snap-fit between snap-fit projection 412 and snap-fit recess 408 can be secured. Snap-fit projection 412 and snap-fit recess 408 are respectively sized and positioned to form a snap-fit attachment of filter retainer 402 and filter adapter 404. In an embodiment, the snap-fit formed by snap-fit projection 412 and snap-fit recess 408 can position filter contact surfaces 414, 416 opposite one another, separated by a gap that is smaller than an uncompressed thickness of the filter 400, such that filter 400 is compressed when it is clamped by the filter contact surfaces 414 and 416.

Figure 4B:
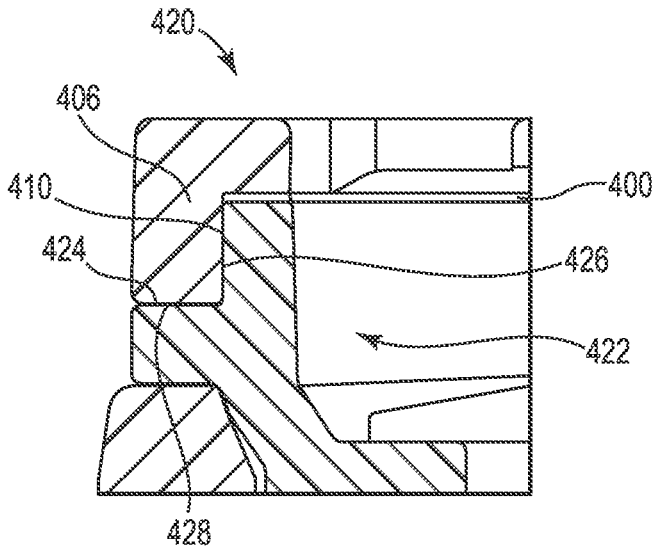
FIG. 4B shows a sectional view of a filter and filter retainer according to an embodiment.

FIG. 4B shows a sectional view of a filter and filter retainer according to an embodiment. Filter 400 is retained by clamping between filter retainer 420 and filter adapter 422. Filter retainer 420 includes outer ring 406, with an inner surface 410 provided in the outer ring 406. Inner surface 410 is a vertical surface, and a horizontal surface 424 is provided at a bottom of the outer ring 406. The filter adapter 422 includes vertical surface 426 and horizontal surface 428 surrounding vertical surface 426. The filter retainer 420 and the filter adapter 422 can be joined by a laser weld formed between inner surface 410 and vertical surface 426, and/or between horizontal surfaces 424, 426.

Figure 4C:
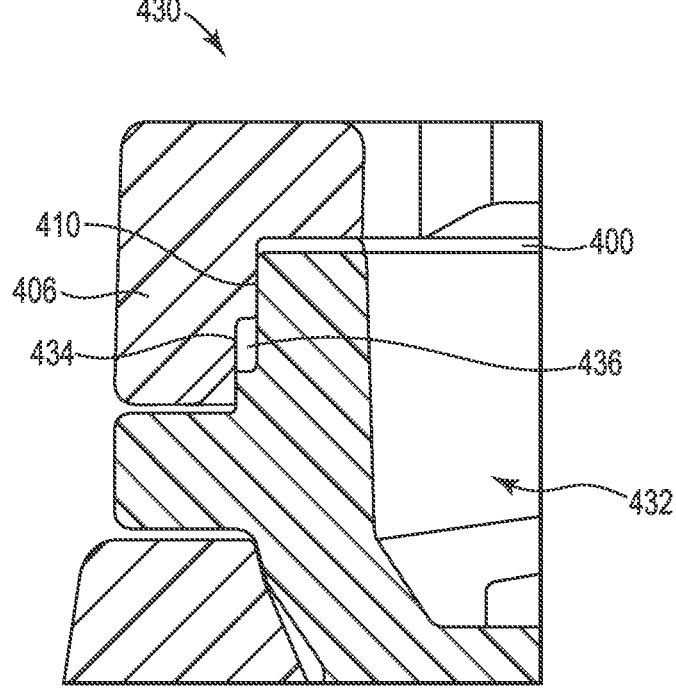
FIG. 4C shows a sectional view of a filter and filter retainer according to an embodiment.

FIG. 4C shows a sectional view of a filter and filter retainer according to an embodiment. Filter 400 is retained by clamping between filter retainer 430 and filter adapter 432. Filter retainer 430 includes outer ring 406, with ultrasonic welding feature 434 formed on an inner surface 410 provided in the outer ring 406. The filter adapter 432 includes ultrasonic welding feature 436. Ultrasonic welding features 434, 436 can interface with one another when the filter retainer 430 and filter adapter 432 are placed together, and form a weld joining filter retainer 430 to filter retainer 432 when ultrasonic energy is provided.

Figure 4D:
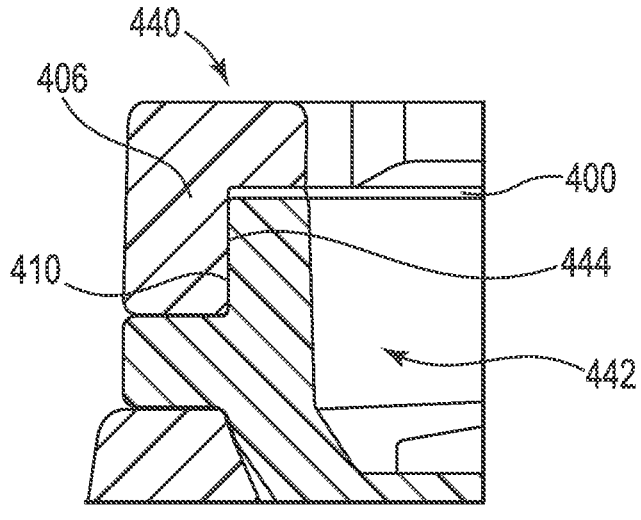
FIG. 4D shows a sectional view of a filter and filter retainer according to an embodiment.

FIG. 4D shows a sectional view of a filter and filter retainer according to an embodiment. Filter 400 is retained by clamping between filter retainer 440 and filter adapter 442. Filter retainer 440 includes outer ring 406 having an inner surface 410 provided in the outer ring 406. The filter adapter 442 includes press-fit surface 444. Inner surface 410 and press-fit surface 444 are respectively sized such that the filter retainer 440 can be attached to filter adapter 442 by a press-fit and friction between inner surface 410 and press-fit surface 444.

Figure 4E:
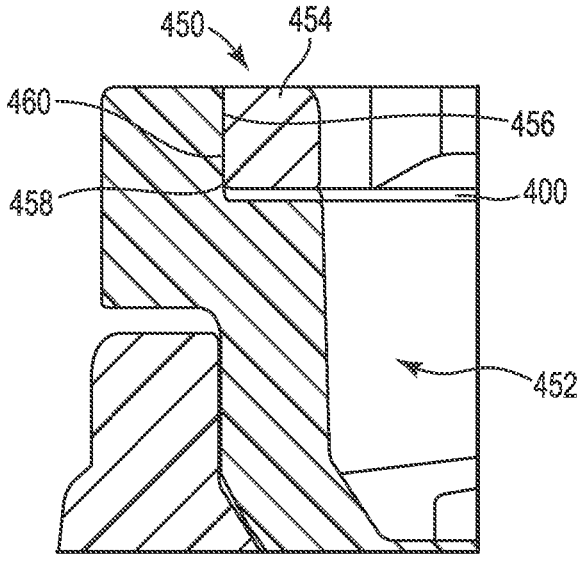
FIG. 4E shows a sectional view of a filter and filter retainer according to an embodiment.

FIG. 4E shows a sectional view of a filter and filter retainer according to an embodiment. Filter 400 is retained by clamping between filter retainer 450 and filter adapter 452. Filter retainer 450 includes outer ring 454, having an outer surface 456 forming the perimeter of outer ring 454. The filter adapter 404 includes a recess 458 including inner surface 460 defining a perimeter of recess 458. Outer surface 456 of the filter retainer 450 and inner surface 460 are respectively sized such that the filter retainer 450 can be attached to filter adapter 452 by a press-fit and friction between outer surface 456 and inner surface 460.

Figure 5:
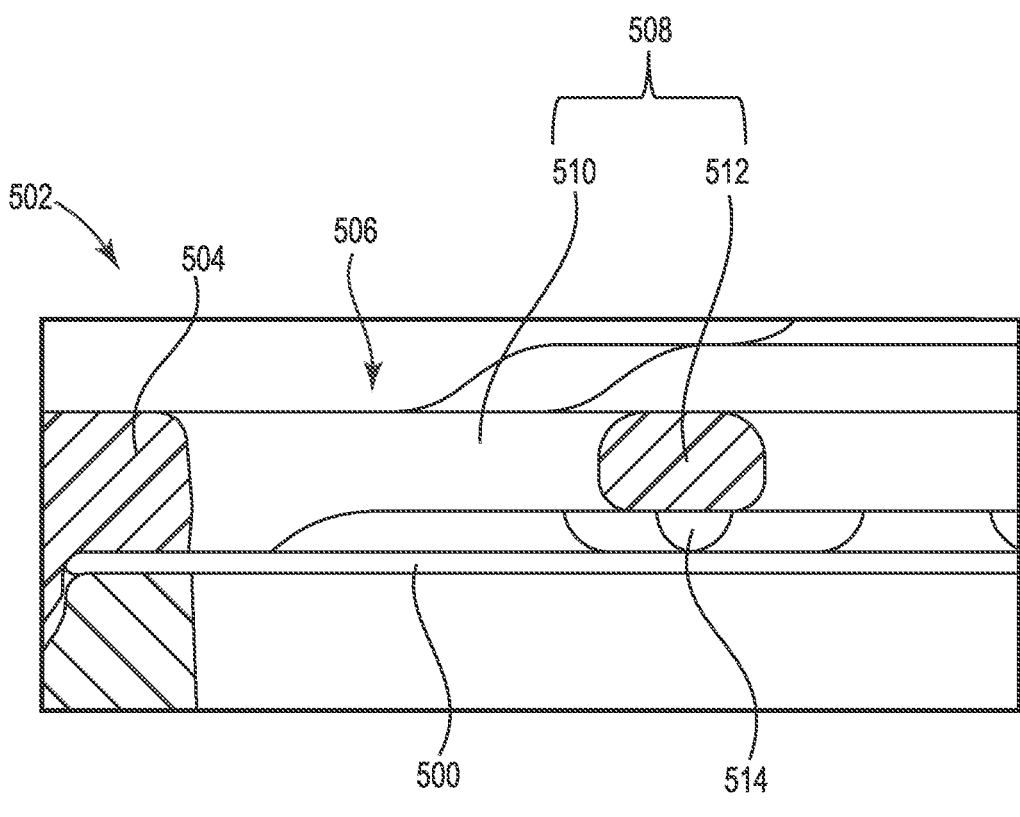
FIG. 5 shows another sectional view of a filter and filter retainer according to an embodiment.

FIG. 5 shows another sectional view of a filter and filter retainer according to an embodiment. Filter 500 is retained by filter retainer 502. Filter retainer 502 includes an outer ring 504 that defines an opening 506. Retention elements 508 extend into or across the opening 506. In the embodiment shown in FIG. 5, the retention elements 508 include spokes 510 and central ring 512. Stand-offs 514 are provided on filter retainer 502, on a side facing towards filter 500.

Filter 500 is a filter retained at least in part by filter retainer 502. In an embodiment, filter 500 is one or more pieces of filter media. In an embodiment, filter 500 includes a coating or a container on or surrounding filter media. In an embodiment, the container for the filter media of filter 500 is sheets of permeable materials joined to one another, for example by way of an ultrasonic weld.

Filter retainer 502 is configured to retain filter 500 at a filter adapter, such as filter adapter 404 as discussed above and shown in FIG. 4. Filter retainer 502 can be, for example, filter retainer 302 as discussed above and shown in FIG. 3. The filter retainer 502 includes outer ring 504. While filter retainer 502 is shown as cylindrical in shape with outer ring 504 having a circular profile, it is understood that filter retainer 502 can have any suitable shape to correspond to the filter adapter that filter retainer 502 is to be used with. The outer ring 504 of filter retainer 502 defines opening 506. Opening 506 allows fluids to pass into or out of filter 500. The retention elements 508 extend into or across opening 506. The retention elements 508 can support filter 500, for example to prevent pressure from blowing filter 500 out of filter retainer 502 and its corresponding filter adapter. In an embodiment, the retention elements 508 extend across the opening 506. In an embodiment, the retention elements 508 form a grid over the opening 506. The retention elements can form radial patterns, such as a plurality of retention elements 508 meeting at a center of opening 506, or, as shown in FIG. 5, a plurality of spokes 510 that each join a center ring 512.

Stand-offs 514 are provided on the retention elements 508 on a side of the retention elements 508 facing filter 500. In an embodiment, the stand-offs 514 are formed integrally with the retention elements 508. In an embodiment, the stand-offs 514 are the only point within the perimeter of opening 506 where the filter retainer 502 contacts filter 500. The stand-offs 514 can be sized such that the surface area of the stand-offs 514 contacting filter 500 is smaller than a surface area of the retention elements 508. Accordingly, the stand-offs can increase the unobstructed surface area of filter 500 when it is retained by filter retainer 502. The increase in unobstructed surface area can reduce a pressure drop across the filter 500. In an embodiment, the reduction in the pressure drop across the filter 500 can be up to 20% when compared to a filter 500 retained by contacting the entire corresponding surface of retention elements lacking such stand-offs. Stand-offs 514 can be sized and positioned based on the support requirements and mechanical properties of the filter 500 that filter retainer 502 is used to retain. For example, the stiffness of the filter media and/or the pressure on the filter 500 can affect the number of stand-offs 514, their positioning, and/or the area of those stand-offs 514 that is required to reduce flexing or bowing of the filter beyond allowable levels. In the embodiment shown in FIG. 5, the stand-offs 514 are provided at one or more junctions between spokes 510 and central ring 512.

Figure 6:
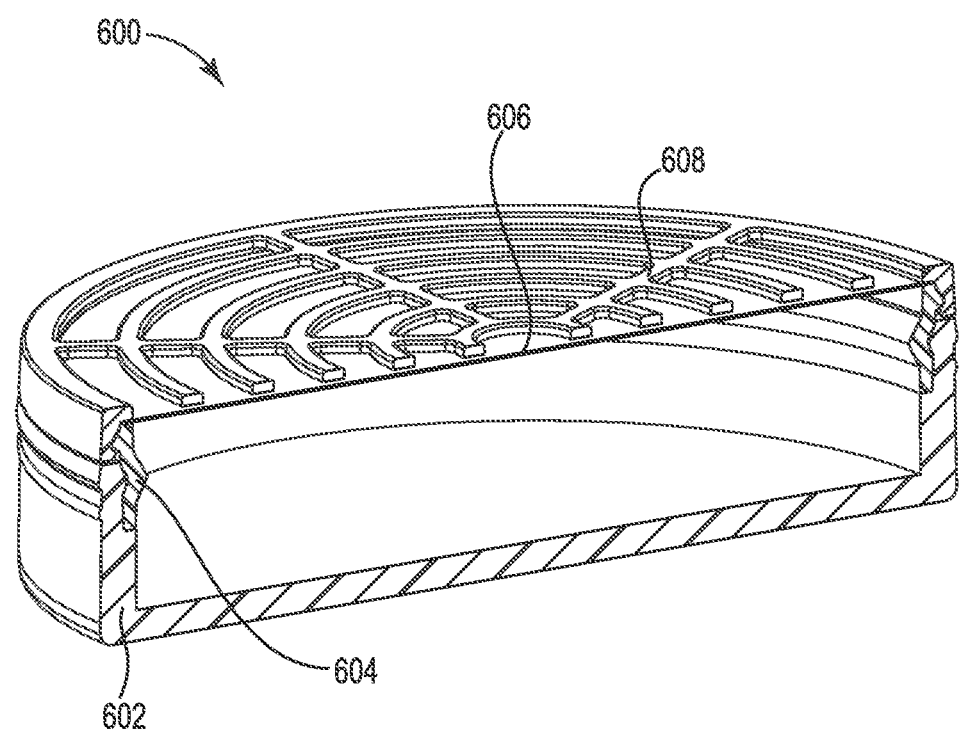
FIG. 6 shows a perspective view of a canister according to an embodiment.

FIG. 6 shows a perspective view of a canister according to an embodiment. Canister 600 includes resilient canister body 602, filter adapter 604, filter 606, and filter retainer 608. Canister 600 is configured to accommodate a substance. In an embodiment, the substance can be a gas to be released. In an embodiment, the substance can be a solid or liquid configured to produce a gas to be released. In an embodiment, the substance can be configured or selected to interact with fluid passing through filter 606, such a desiccant, reagents, or the like. Canister 600 can be configured to be inserted inside another container or retained at a particular position in an apparatus, for example as a desiccant container for use in a wafer container such as a FOUP.

Container body 602 is a resilient body configured to define an internal space. Container body 602 can include a bore configured to accommodate a portion of filter adapter 604, such as bore 216 described above and shown in FIG. 2.

Filter adapter 604 is configured to allow attachment of a filter 606 to the container body 602. The filter adapter 604 can include a portion configured to be inserted into container body 602 at the bore. The filter adapter 604 and/or container body 602 can include features configured to retain container body 602 and filter adapter 604 together, such as annular projections and optionally depressions, sizing to form a press-fit between the filter adapter 604 at the bore, or the like. The filter adapter 604 can include an end having an attachment feature configured to allow attachment of filter retainer 608. The end and the attachment feature can be, for example, according to the structure of filter housing attachment features 242 as described above and shown in FIG. 2.

Filter 606 includes filter media and optionally a coating or covering. Filter 606 can be any suitable filter for use in filtering fluid passing into or out of container 600. The filter 606 can be retained in position by being clamped between port 604 and filter retainer 608. In an embodiment, filter 606 is retained only by the clamping between port 604 and filter retainer 608. In an embodiment, the filter 606 can be retained, for example, by use of an adhesive, a weld, or any other such method of retention.

Filter retainer 608 can be joined to the end of filter adapter 604 so as to hold filter 606 in place over said end of filter adapter 604. In an embodiment, filter retainer 608 includes a feature configured to engage with the attachment feature provided on the end of filter adapter 604, for example one or more projections or recesses configured to form a snap-fit or other such engagement with corresponding attachment features of the end of filter adapter 604. In an embodiment, the feature on filter retainer 608 is an annular projection or recess configured to form an annular snap-fit with the end of filter adapter 604. Filter retainer 608 can include filter retention elements such as filter retention elements 234 described above and shown in FIG. 2. In an embodiment, the filter retention elements can include stand-offs, such as stand-offs 236 as described above and shown in FIG. 2.

FIG. 7 shows a perspective view of an enclosure according to an embodiment. Enclosure 700 includes port 702, filter 704, and filter retainer 706. Enclosure 700 can define an internal space. Enclosure 700 can be, for example, a wafer container such as a FOUP. The enclosure 700 can include one or more ports 702 configured to supply a fluid to the internal space, such as additional purge ports provided on the enclosure 700. The one or more ports 702 can each project into the internal space. Each of the one or more ports 702 can include an end having an attachment feature configured to allow attachment of filter retainer 706. The end and the attachment feature can be, for example, according to the structure of filter housing attachment features 242 as described above and shown in FIG. 2.

Filter 704 includes filter media and optionally a coating or covering. Filter 704 can be any suitable filter for use in filtering fluid passing through port 702 into enclosure 700. The filter 704 can be retained in position by being clamped between port 702 and filter retainer 706. In an embodiment, filter 704 is retained only by the clamping between port 702 and filter retainer 706. In an embodiment, the filter 704 can be retained, for example, by use of an adhesive, a weld, or any other such method of retention.

Filter retainer 706 can be joined to port 702 so as to hold filter 704 in place over port 702. In an embodiment, filter retainer 706 includes a feature configured to engage with the attachment feature provided on port 702, for example one or more projections or recesses configured to form a snap-fit or other such engagement with corresponding attachment features of port 702. In an embodiment, the feature on filter retainer 706 is an annular projection or recess configured to form an annular snap-fit with port 702. Filter retainer 706 can include filter retention elements such as filter retention elements 234 described above and shown in FIG. 2. In an embodiment, the filter retention elements can include stand-offs, such as stand-offs 236 as described above and shown in FIG. 2.

FIG. 8 shows a container according to an embodiment. Container 800 includes a container body 802, a filter adapter 804, filter 806, and filter retainer 808. Container 800 can be a rigid container configured to store a substance. In an embodiment, the substance can be a gas to be released. In an embodiment, the substance can be a solid or liquid configured to produce a gas to be released. In an embodiment, substance can be configured or selected to interact with fluid passing through filter 806, such a desiccant, reagents, or the like.

Container body 802 is a rigid body defining an internal space configured to accommodate the substance. The container body is further configured to be enclosed by attachment of the filter adapter 804. Filter adapter 804 can be, for example, a lid for the container 800, configured to be joined to container body 802 to enclose the internal space. The filter adapter 804 can include a projection having an end, with the end having an attachment feature configured to allow attachment of filter retainer 808. The end and the attachment feature can be, for example, according to the structure of filter housing attachment features 242 as described above and shown in FIG. 2.

Filter 806 includes filter media and optionally a coating or covering. Filter 806 can be any suitable filter for use in filtering fluid passing into or out of container 800. The filter 806 can be retained in position by being clamped between port 804 and filter retainer 808. In an embodiment, filter 806 is retained only by the clamping between port 804 and filter retainer 808. In an embodiment, the filter 806 can be retained, for example, by use of an adhesive, a weld, or any other such method of retention.

Filter retainer 808 can be joined to the projection formed in filter adapter 804 so as to hold filter 806 in place over said projection from filter adapter 804. In an embodiment, filter retainer 808 includes a feature configured to engage with the attachment feature provided on the projection from filter adapter 804, for example one or more projections or recesses configured to form a snap-fit or other such engagement with corresponding attachment features of the projection from filter adapter 804. In an embodiment, the feature on filter retainer 808 is an annular projection or recess configured to form an annular snap-fit with the projection from filter adapter 804. Filter retainer 808 can include filter retention elements such as filter retention elements 234 described above and shown in FIG. 2. In an embodiment, the filter retention elements can include stand-offs, such as stand-offs 236 as described above and shown in FIG. 2.

Figure 9:
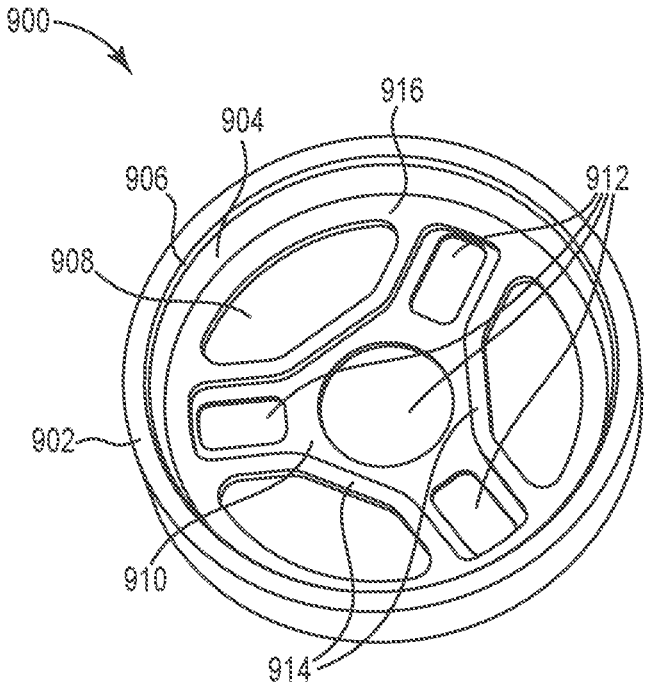
FIG. 9 shows a filter retainer according to an embodiment.

FIG. 9 shows a filter retainer according to an embodiment. Filter retainer 900 includes outer ring 902 having inner surface 904 and attachment feature 906. Outer ring 902 defines opening 908. Retention element 910 can be provided within opening 908. Retention element 910 can define passages 912. Filter retention beams 914 can be included in retention element 910. Filter contact surface 916 can also be provided on filter retainer 900.

Filter retainer 900 is configured to be attached to a structure such as a purge module, a port, or a filter adapter such as filter housing 204 to retain a filter such as filter 208, as those are described above and shown in FIG. 2. The filter retainer 900 can, for example, be used in place of filter retainer 608 shown in FIG. 6 and described above, or in place of filter retainer 808 shown in FIG. 8 and described above. The filter retainer 900 can be a single piece in an example embodiment. The filter retainer 900 can be made of a rigid plastic material, such as polycarbonate, high-density or ultra-high molecular weight polyethylene (HDPE or UHMWPE), or any other such suitable rigid polymer material.

Outer ring 902 defines the perimeter of filter retainer 900. While the outer ring 902 is shown as being circular in profile in FIG. 3, it is understood that filter retainer 900 can be shaped to correspond to the purge module, port, or filter adapter it is configured to be used with, with corresponding changes to the shape of outer ring 902, such as oval, square, rectangular, or other such profiles.

Inner surface 904 is provided on a bore defined by outer ring 902. The bore defined by inner surface 904 is configured to fit over a purge module, port, or filter adapter. An attachment feature 906 can be formed on or in the bore defined by inner surface 904. The attachment feature 906 can include one or more projections from or depressions in inner surface 904. In an embodiment, the attachment feature 906 is an annular groove formed in inner surface 904. In an embodiment, the attachment feature 906 is an annular projection formed on inner surface 904. Attachment feature 906 can be configured to interface with one or more features formed on the purge module, port, or filter adapter that filter retainer 900 is used with. The attachment feature 906 can allow the filter retainer 900 to be joined to the corresponding purge module, port, or filter adapter by a mechanical connection such as a snap-fit. In an embodiment, the snap-fit is a snap-fit between an annular attachment feature 906 and a corresponding annular feature on the corresponding purge module, port, or filter adapter. Other examples of attachment features can include continuous or interrupted threading, a plurality of snap-fit features, one or more interference fit surfaces, detents, or the like.

Opening 908 is defined by the outer ring 902. In an embodiment, opening 908 is surrounded by the filter contact surface 916 described below. Opening 908 is configured to allow fluid passing through the filter to further pass through the filter retainer 900. Multiple passages 912 can be defined within opening 908 by retention element 910. Passages 912 can allow purge gas passing through the filter retained by filter retainer 900 to exit the purge module after passing through the filter retained by filter retainer 900.

Retention element 910 can extend across opening 908. Retention element 910 can prevent escape and reduce or prevent bowing of the filter when it is retained by filter retainer 900 and pressure is applied to the filter, for example by the fluid passing through said filter. In the embodiment shown in FIG. 9, the retention element includes spokes each defining a rectangular passage 912 in said spoke, the spokes meeting where another passage 912 is defined at a center of opening 908.

Filter retention beams 914 are included in retention element 910. In the embodiment shown in FIG. 9, the filter retention beams extend along the outer perimeters of the spokes of retention element 910. The filter retention beams 914 can extend continuously over a distance from a first point on the outer ring 902 to a second point on the outer ring 902. Filter retention beams 914 can be used as stand-offs for the filter, for example, in place of or in addition to stand-offs 236, 316, and/or 514 as described above and shown in FIGS. 2, 3, and 5, respectively. The filter retention beams 914 provide a contact surface configured to contact the filter that is smaller than the surface of the retention elements 310 that could otherwise contact the filter. The stress resulting from contact between the filter and filter retention beams 914 can be distributed across the length of the filter retention beams 914.

Filter contact surface 916 is a surface of filter retainer 900 between the inner surface 904 and the opening 908. The filter contact surface 916 can include some or all of that area between inner surface 904 and opening 908. Filter contact surface 916 faces towards the filter when filter retainer 900 is installed on the corresponding purge module, port, or filter adapter. In an embodiment, filter contact surface 916 contacts the filter such that the filter is compressed when filter retainer 900 is installed. In an embodiment, the filter is attached to filter contact surface 916 by a weld or adhesive. In an embodiment, the compression of the filter by filter contact surface 916 and a surface of the purge module, port, or filter adapter is the only force retaining the filter in place. In an embodiment, the filter contact surface 916 is a flat surface. In an embodiment, the filter contact surface includes texturing such as projections, grooves, surface roughness, combinations thereof, or the like to engage the filter. In an embodiment, the filter retention beams 914 connect to the filter contact surface, such that the contact with the filter is continuous from the filter contact surface across an entire length of each of the filter retention beams.

ASPECTS

It is understood that any of aspects 1-10 can be combined with any of aspects 11-19, 20-24, 25-33, 34-47, 48, 49-53, 54-61, or 62-69. It is understood that any of aspects 11-19 can be combined with any of aspects 20-24, 25-33, 34-47, 48, 49-53, 54-61, or 62-69. It is understood that any of aspects 20-24 can be combined with any of aspects 25-33, 34-47, 48, 49-53, 54-61, or 62-69. It is understood that any of aspects 25-33 can be combined with any of 34-47, 48, 49-53, 54-61, or 62-69. It is understood that any of aspects 34-47 can be combined with any of aspects 48, 49-53, 54-61, or 62-69. It is understood that aspect 48 can be combined with any of aspects 49-53, 54-61, or 62-69. It is understood that any of aspects 49-53 can be combined with any of aspects 54-61, or 62-69. It is understood that any of aspects 54-61 can be combined with any of aspects 62-69.

Aspect 1. A gas exchange module for a substrate container, comprising:

a filter housing;

an interface body including a bore configured to receive the filter housing;

a filter disposed at an end of the filter housing; and a filter retainer joined to the filter housing.

Aspect 2. The gas exchange module according to aspect 1, wherein the filter housing further comprises a valve.

Aspect 3. The gas exchange module according to aspect 2, wherein the valve is a check valve.

Aspect 4. The gas exchange module according any of aspects 1-3, wherein the valve interface body includes one or more retention features disposed on an exterior surface of the interface body.

Aspect 5. The gas exchange module according to any of aspects 1-4, wherein the filter retainer is joined to the filter housing by a snap fit formed between one or more first snap fit features provided on the filter retainer and one or more second snap fit features provided on the filter housing.

Aspect 6. The gas exchange module according to any of aspects 1-4, wherein the filter retainer is joined to the filter housing by a weld.

Aspect 7. The gas exchange module according to any of aspects 1-4, wherein the filter retainer is joined to the filter housing by a press-fit.

Aspect 8. The gas exchange module according to aspects 5-7, wherein the filter is retained only by compression between a first retaining surface provided on the filter retainer and a second retaining surface provided on the filter housing.

Aspect 9. The gas exchange module according to any of aspects 1-8, wherein the filter retainer includes a retention element provided in an opening defined by the filter retainer, the retention element including a plurality of pairs of spokes, each of the plurality of pairs of spokes extending towards a center, the center defining a passage; each of the plurality of spokes including a filter retention beam configured to contact the filter, wherein a total surface area of the filter retention beams is less than a total surface area of the retention element.

Aspect 10. The gas exchange module according to any of aspects 1-9, wherein the interface body comprises a resilient material.

Aspect 11. A substrate container, comprising:

a substrate container body defining an internal space, the substrate container including a gas exchange port;

a gas exchange module disposed in the gas exchange port, the gas exchange module including:

a filter housing;

an interface body, the interface body including a bore configured to receive the filter housing;

a filter disposed at an end of the filter housing; and a filter retainer joined to the filter housing, wherein the interface body is configured to form a seal at a perimeter of the gas exchange port when the gas exchange module is disposed in the gas exchange port.

Aspect 12. The substrate container according to aspect 11, wherein the interface body includes one or more retention features disposed on an exterior surface of the interface body and the gas exchange port includes one or more openings configured to receive the one or more retention features disposed on the exterior surface of the interface body.

Aspect 13. The substrate container according to any of aspects 11-12, wherein the filter housing includes a valve.

Aspect 14. The substrate container according to any of aspects 11-13, wherein the filter retainer is joined to the filter housing by a snap fit formed between one or more first snap fit features provided on the filter retainer and one or more second snap fit features provided on the filter housing.

Aspect 15. The substrate container according to any of aspects 11-13, wherein the filter retainer is joined to the filter housing by a weld.

Aspect 16. The substrate container according to any of aspects 11-13, wherein the filter retainer is joined to the filter housing by a press-fit.

Aspect 17. The substrate container according to any of aspects 14-16, wherein the filter is retained only by compression between a first retaining surface provided on the filter retainer and a second retaining surface provided on the filter housing.

Aspect 18. The substrate container according to any of aspects 11-17, wherein the filter retainer includes a retention element provided in an opening defined by the filter retainer, the retention element including a plurality of pairs of spokes, each of the plurality of pairs of spokes extending towards a center, the center defining a passage; each of the plurality of spokes including a filter retention beam configured to contact the filter, wherein a total surface area of the filter retention beams is less than a total surface area of the retention element.

Aspect 19. The substrate container according to any of aspects 11-18, wherein the interface body comprises a resilient material.

Aspect 20. A method of providing gas exchange in a substrate container, comprising:

assembling a gas exchange module by inserting filter housing into a bore of an interface body, positioning a filter between the filter housing and a filter retainer, and attaching the filter retainer to the filter housing; and inserting the gas exchange module into a gas exchange port of a substrate container.

Aspect 21. The method according to aspect 20, wherein attaching the filter retainer to the filter housing includes forming a snap fit between one or more first snap fit features provided on the filter retainer and one or more second snap fit features provided on the filter housing.

Aspect 22. The method according to aspect 21, wherein the filter is retained only by compression between a first retaining surface provided on the filter retainer and a second retaining surface provided on the filter housing.

Aspect 23. The method according to any of aspects 20-22, wherein the inserting the gas exchange module into the gas exchange port of the substrate container includes forming an interface between openings provided in the gas exchange port and one or more retention features provided on an outer surface of the interface body.

Aspect 24. The method according to any of aspects 20-23, further comprising directing a gas flow through the interface body, passing the gas flow through a valve provided in the filter housing, and passing the gas flow through the filter.

Aspect 25. A filter retainer, comprising:

a filter retention body defining an opening, the filter retention body having one or more retention elements extending into the opening in a direction transverse to the opening, wherein at least one of the one or more retention elements include one or more stand-offs, each of the one or more stand-offs projecting from a side of the one or more retention elements configured to face a filter to be secured by the filter retainer, and a surface area of contact surfaces of the one or more stand-offs is less than a surface area of the one or more retention elements.

Aspect 26. The filter retainer according to aspect 25, wherein the opening is circular in shape.

Aspect 27. The filter retainer according to any of aspects 25-26, wherein the one or more retention elements include a central body and a plurality of spokes.

Aspect 28. The filter retainer according to aspect 27, wherein the one or more stand-offs are disposed at junctions between the central body and the plurality of spokes.

Aspect 29. The filter retainer according to any of aspects 25-28, wherein the one or more retention elements include a plurality of spokes configured to meet at a center of the opening.

Aspect 30. The filter retainer according to any of aspects 25-29, wherein the one or more retention elements form a grid over the opening.

Aspect 31. The filter retainer according to any of aspects 25-26, wherein the one or more retention elements including a plurality of pairs of spokes, each of the plurality of pairs of spokes extending towards a center, the center defining a passage.

Aspect 32. The filter retainer according to aspect 31, wherein the one or more stand-offs are filter retention beams provided on the spokes of the plurality of pairs of spokes.

Aspect 33. The filter retainer according to any of aspects 25-32, wherein the filter retention body includes an attachment portion including a snap fit feature.

Aspect 34. A filter assembly, comprising:

a filter; and a filter retainer, the filter retainer including a filter retention body defining an opening, the filter retention body having one or more retention elements extending into the opening in a direction transverse to the opening, wherein at least one of the one or more retention elements include one or more stand-offs, each of the one or more stand-offs projecting from a side of the one or more retention elements configured to face the filter, a surface area of contact surfaces of the one or more stand-offs is less than a surface area of the one or more retention elements, and the filter contacts the filter retainer at the stand-offs.

Aspect 35. The filter assembly according to aspect 34, wherein the opening is circular in shape.

Aspect 36. The filter assembly according to any of aspects 34-35, wherein the one or more retention elements include a central body and a plurality of spokes.

Aspect 37. The filter assembly according to aspect 36, wherein the one or more stand-offs are disposed at junctions between the central body and the plurality of spokes.

Aspect 38. The filter assembly according to any of aspects 36-37, wherein the central body is a ring.

Aspect 39. The filter assembly according to any of aspects 34-38, wherein the one or more retention elements include a plurality of spokes configured to meet at a center of the opening.

Aspect 40. The filter assembly according to any of aspects 34-39, wherein the one or more retention elements form a grid over the opening.

Aspect 41. The filter assembly according to any of aspects 34-35, wherein the one or more retention elements including a plurality of pairs of spokes, each of the plurality of pairs of spokes extending towards a center, the center defining a passage.

Aspect 42. The filter retainer according to aspect 41, wherein the one or more stand-offs are filter retention beams provided on the spokes of the plurality of pairs of spokes.

Aspect 43. The filter assembly according to any of aspects 34-42, wherein the filter retention body includes an attachment portion including a snap fit feature.

Aspect 44. The filter assembly according to any of aspects 34-42, further comprising a canister, the filter retention joined to the canister.

Aspect 45. The filter assembly according to any of aspects 34-42, further comprising a purge port, the filter retention joined to the purge port.

Aspect 46. The filter assembly according to any of aspects 34-42, further comprising a gas exchange module, the filter retention joined to the gas exchange module.

Aspect 47. The filter assembly according to any of aspects 34-42, further comprising an enclosure having a port, the filter retention joined to the port.

Aspect 48. A method of retaining a filter, comprising securing the filter using a filter retainer, the filter retainer including a filter retention body defining an opening, the filter retention body having one or more retention elements extending into the opening in a direction transverse to the opening, wherein at least one of the one or more retention elements include one or more stand-offs, each of the one or more stand-offs projecting from a side of the retention elements configured to face a filter to be secured by the filter retainer, a surface area of contact surfaces of the one or more retention elements is less than a surface area of the one or more retention elements, and the filter contacts the filter retainer at the stand-offs.

Aspect 49. A filter retainer, comprising:
a filter retainer body defining an opening, the filter retainer body having a contact surface surrounding the opening, a filter contact surface, and a snap fit retention feature provided on one or more inner surfaces of one or more walls, the one or more walls surrounding the filter contact surface.

Aspect 50. The filter retainer according to aspect 49, wherein the snap fit retention feature is an annular projection.

Aspect 51. The filter retainer according to aspect 49, wherein the snap fit retention feature includes a plurality of projections.

Aspect 52. The filter retainer according to aspect 49, wherein the snap fit retention feature is an annular groove.

Aspect 53. The filter retainer according to aspect 49, wherein the snap fit retention feature includes a plurality of depressions formed in the one or more inner surfaces.

Aspect 54. A filter assembly, comprising:
a port body, the port body including a port filter contact surface and a port snap fit feature;
a filter; and
a filter retainer, the filter retainer including a filter retainer body defining an opening, the filter retainer body having a contact surface surrounding the opening, a retainer filter contact surface, and a retainer snap fit feature provided on one or more inner surfaces of one or more walls, the one or more walls surrounding the filter contact surface.
wherein a portion of the filter is compressed between the port filter contact surface and the retainer filter contact surface, and the port snap fit feature is configured to form a snap fit with the retainer snap fit feature.

Aspect 55. The filter assembly according to aspect 54, wherein the filter is retained only by compression between the port filter contact surface and the retainer filter contact surface.

Aspect 56. The filter assembly according to any of aspects 54-55, wherein the port body is included in a canister, the canister having a canister body including a resilient material.

Aspect 57. The filter assembly according to any of aspects 54-55, wherein the port body is included in a purge port.

Aspect 58. The filter assembly according to any of aspects 54-55, wherein the port body is included in an enclosure.

Aspect 59. The filter assembly according to any of aspects 54-55, wherein the port body is included in a gas exchange module.

Aspect 60. The filter assembly according to any of aspects 54-59, wherein the filter retainer includes one or more retention elements extending across an opening of the filter retainer, wherein:
at least one of the one or more retention elements includes one or more stand-offs, each of the one or more stand-offs projecting from a side of the one or more retention elements configured to face the filter, a surface area of contact surfaces of the one or more stand-offs is less than a surface area of the one or more retention elements, and the filter contacts the filter retainer at the stand-offs.

Aspect 61. The filter assembly according to any of aspects 54-59, wherein the filter retainer includes a retention element provided in an opening defined by the filter retainer, the retention element including a plurality of pairs of spokes, each of the plurality of pairs of spokes extending towards a center, the center defining a passage; each of the plurality of spokes including a filter retention beam configured to contact the filter, wherein a total surface area of the filter retention beams is less than a total surface area of the retention element.

Aspect 62. A method of assembling a filter assembly, comprising:
placing a filter between a port body and a filter retainer; and
snapping the filter retainer onto the port body such that one or more port body snap fit features provided on the port body engage with one or more retainer snap fit features provided on the filter retainer.

Aspect 63. The method according to aspect 62, wherein the filter is compressed between a port filter contact surface and a retainer filter contact surface.

Aspect 64. The method according to aspect 63, further comprising retaining a position of the filter only by the compression of the filter between the port filter contact surface and the retainer filter contact surface.

Aspect 65. The method according to any of aspects 62-64, further comprising contacting the filter at stand-offs provided on one or more retention elements extending into an opening of the filter retainer, wherein a contact area of the stand-offs is less than a surface area of the one or more retention elements.

Aspect 66. The method according to any of aspects 62-65, wherein the port body is included in a canister.

Aspect 67. The method according to any of aspects 62-65, wherein the port body is included in a purge port.

Aspect 68. The method according to any of aspects 62-65, wherein the port body is included in an enclosure.

Aspect 69. The method according to any of aspects 62-65, wherein the port body is included in a gas exchange module.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:

1. A substrate container, comprising:
a substrate container body defining an internal space, the substrate container including a gas exchange port;
a gas exchange module disposed in the gas exchange port, the gas exchange module including:
a filter housing;
an interface body including a bore configured to receive the filter housing;
a filter disposed at an end of the filter housing; and
a filter retainer joined to the filter housing;
wherein the interface body is configured to form a seal at a perimeter of the gas exchange port when the gas exchange module is disposed in the gas exchange port,
wherein the filter retainer includes a retention element provided in an opening defined by the filter retainer, the retention element including a plurality of pairs of spokes, each of the plurality of pairs of spokes extending towards a center, the center defining a passage; each of the plurality of spokes including a filter retention beam configured to contact the filter,
wherein a total surface area of the filter retention beams is less than a total surface area of the retention element.

2. The substrate container of claim 1, wherein the interface body includes one or more retention features disposed on an exterior surface of the interface body and the gas exchange port includes one or more openings configured to receive the one or more retention features disposed on the exterior surface of the interface body.

3. The substrate container of claim 1, wherein the filter housing includes a valve.

4. The substrate container of claim 1, wherein the filter retainer is joined to the filter housing by a snap fit formed between one or more first snap fit features provided on the filter retainer and one or more second snap fit features provided on the filter housing.

5. The substrate container of claim 4, wherein the filter is retained only by compression between a first retaining surface provided on the filter retainer and a second retaining surface provided on the filter housing.

6. The substrate container of claim 1, wherein the interface body comprises a resilient material.

* * * * *